(12) United States Patent
Tomikawa et al.

(10) Patent No.: US 6,915,694 B2
(45) Date of Patent: Jul. 12, 2005

(54) DOUBLE-ENDED TUNING FORK VIBRATORY GYRO-SENSOR

(75) Inventors: Yoshiro Tomikawa, Yamagata (JP); Kenji Sato, Kawasaki (JP); Atsushi Ono, Kawasaki (JP)

(73) Assignee: Toyo Communication Equipment Co., Ltd., Kanagawa (JP)

( * ) Notice: Subject to any disclaimer, the term of this patent is extended or adjusted under 35 U.S.C. 154(b) by 0 days.

(21) Appl. No.: 10/664,821

(22) Filed: Sep. 17, 2003

(65) Prior Publication Data

US 2005/0056095 A1 Mar. 17, 2005

(51) Int. Cl.[7] ............................................. G01P 9/04
(52) U.S. Cl. ................................................ 73/504.16
(58) Field of Search ......................... 73/510.16, 504.14, 73/504.12; 310/329

(56) References Cited

U.S. PATENT DOCUMENTS

| 5,767,405 A | * | 6/1998 | Bernstein et al. | ........ 73/504.16 |
| 6,227,048 B1 | * | 5/2001 | Kikuchi et al. | .......... 73/504.12 |
| 6,481,283 B1 | * | 11/2002 | Cardarelli | ................ 73/504.02 |

FOREIGN PATENT DOCUMENTS

| JP | 04-029012 | 1/1992 |
| JP | 11-281372 | 10/1999 |
| JP | 2001-050751 | 2/2001 |
| JP | 2004-101392 | 4/2004 |

OTHER PUBLICATIONS

"FEM Simulation of Quarts Crystal Double–Ended Tuning Fork Resonator for its Application to Vibratory Gyro–Sensor" by Kenji Sato; Atsushi Ono and Yoshio Tomikawa at The 23rd Symposium on Ulrasonic Electronics, Nov. 7–9, 2002 in Kanazawa, Japan, pp. 325–326.

Patent Abstracts of Japan for JP11–281372 published on Oct. 15, 1999.

"Experimental Investigation of Flatly Supported Vibratory Gyro–Sensor Using Quartz Crystal Trident–Type Tuning Fork Resonator" by Shiratori et al., Transducers '99, No. 3P2.26, pp. 82–85 at The 10th International Conference on Solid–State Sensors and Actuators, Jun. 7–10, 1999 in Kanazawa, Japan.

Patent Abstracts of Japan for 2004–101392 published on Apr. 2, 2004.

Patent Abstracts of Japan for 04–029012 published on Jan. 31, 1992.

Patent Abstracts of Japan for 2001–050751 published on Feb. 23, 2001.

* cited by examiner

*Primary Examiner*—John E. Chapman
(74) *Attorney, Agent, or Firm*—Darby & Darby

(57) ABSTRACT

The object of the present invention is to provide an angular velocity sensor that uses Coriolis force with a flatly supported double tuning fork structure that uses an in-plane asymmetrical flexural secondary mode. A large support area is used to provide a high-precision angular velocity sensor with superior resistance to vibration and impact. A double tuning fork gyro-sensor is formed integrally from: two arms; a driver electrode formed on the arms; and a double tuning fork supporting the ends of the arms. Also included are: a detection module connected to the double tuning fork support section; a detection electrode formed on the detection module; and a support securing section for the detection module. When there is rotation, the Coriolis force acting on the arms is transferred to the detection module by way of the double tuning fork support section so that an in-plane asymmetrical flexural secondary vibration takes place.

3 Claims, 4 Drawing Sheets

DOUBLE-ENDED TUNING FORK VIBRATORY GYRO-SENSOR

BACKGROUND OF THE INVENTION

The present invention relates to a vibratory gyro-sensor that uses the Coriolis force.

Tuning fork vibratory gyro-sensors that use the Coriolis force are widely used as sensors for detecting the rotation of objects. In particular, flatly supported tuning fork vibratory gyro-sensors are used in a wide variety of applications, e.g., vibration prevention in cameras and car navigation systems, due to the ease with which they can be designed in a thin, compact manner.

In recent years, there has been research into the use of flatly supported tuning fork vibratory gyro-sensors for vehicle control applications. Vehicle control can affect the safety of a vehicle and can be a critical, life-or-death application. As a result, vibratory gyro-sensors used for this type of application must provide high precision, with good vibration and shock resistance.

A conventional flatly supported tuning fork vibratory gyro-sensor is described in "Experimental Investigation of Flatly Supported Vibratory Gyro-Sensor Using Quartz Crystal Trident-Type Tuning Fork Resonator" (N. Shiratori, Y. Tomikawa, and K. Onishi, Transducers '99, No. 3P2.26, pp. 82–85 (1999)). The prior art gyro-sensor described in this document is a type known as a trident tuning fork vibratory gyro-sensor. Generally, trident tuning fork vibratory gyro-sensors form a cantilevered support structure, where three tuning fork arms are secured at one end with the other end free.

Japanese laid-open patent publication number Hei 11-281372 also describes a flatly supported tuning-form vibratory gyro-sensor. In this tuning fork vibratory gyro-sensor, the vibrator is supported at one point at its center of gravity.

The two references describe that the support structures in conventional flatly supported tuning fork vibratory gyro-sensors take the form of single-point support or cantilevered support.

However, with single-point support or cantilevered support used in conventional flatly supported tuning fork vibratory gyro-sensors, the area of the attachment section is small. As a result, if vibration or impact is applied from outside, the vibration or impact can tend to concentrate on the support section. The prior art supports make it possible for the sensor to be damaged in severe conditions, e.g., in a moving vehicle, where many vibrations and impacts occur over a long period of time. Also, if the sensor is formed in a compact design overall, impact tends to concentrate further at the support section.

The above, and other objects, features and advantages of the present invention will become apparent from the following description read in conjunction with the accompanying drawings, in which like reference numerals designate the same elements.

OBJECT AND SUMMARY OF THE INVENTION

The object of the present invention is to overcome the problems described above and to provide a flatly supported tuning fork vibratory gyro-sensor that has superior vibration and shock resistance, high precision, and allows for a compact design.

In order to achieve these objects, the present invention provides a dual tuning fork vibratory gyro-sensor formed integrally from two arms and drive electrodes formed on surfaces of the arms and first and second tuning-form support sections supporting ends of the arms. The dual tuning fork vibratory gyro-sensor includes: first and second detection sections connected to the first and second tuning fork support sections respectively; first and second detection electrodes formed on the first and second detection sections respectively; and first and second support securing sections supporting an end of the first and second detection sections. The arms and the drive electrodes and the first and second tuning fork support sections and the first and second detection sections and the first and second detection electrodes and the first and second support securing sections are formed integrally and detect rotational angular velocity. When the dual tuning fork gyro-sensor rotates, a Coriolis force acting on the arms causes in-plane asymmetrical flexural secondary mode vibrations to be generated at the arms, the in-plane asymmetrical flexural secondary mode vibrations being transferred to the first and second detection sections by way of the first and second dual tuning fork support sections. A detection signal for a rotational angular velocity is output from the first and second detection electrodes.

Another embodiment provides a dual tuning fork vibratory gyro-sensor as described above wherein: a crystal is used as a base material for the dual tuning fork vibratory gyro-sensor, the crystal being cut so that a normal direction of a main plane is a Z axis of a crystal axis; and the first and second detections sections are formed with a rectangular shape.

As a result, the structure provides high precision and superior shock and impact resistance.

Figure 1A:
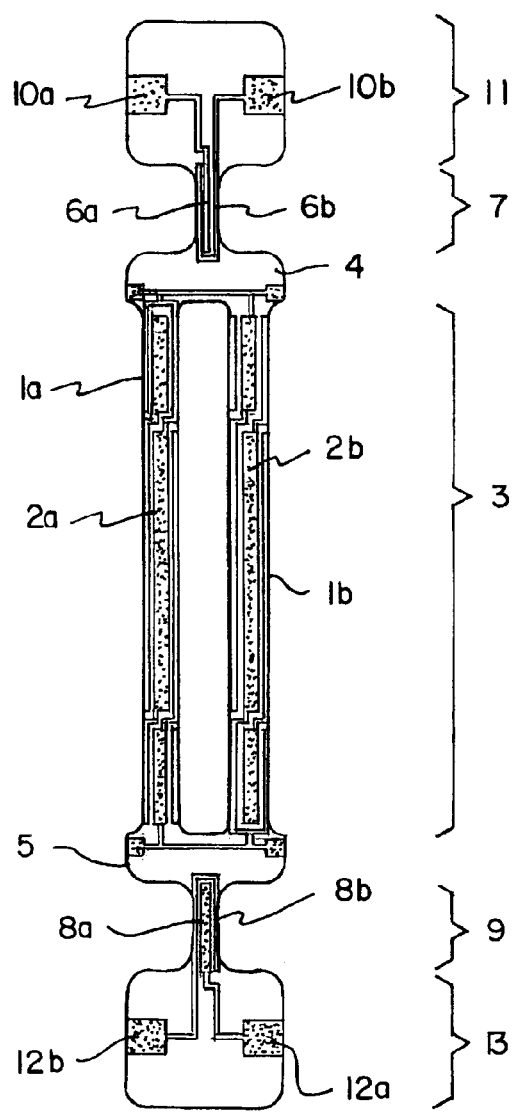
FIG. 1A is a top view of a dual tuning fork vibratory gyro-sensor according to the present invention.

LIST OF DESIGNATORS 1a, 1b: arms
2a, 2b: drive electrodes
3: drive section
4, 5: dual tuning fork support section
6a, 6b: first detection electrode
7: first detection section
8a, 8b: first detection electrode
9: second detection section
10a, 10b: first lead-out electrode
11: first support securing section
12a, 12b: second lead-out electrode
13: second support securing section

DETAILED DESCRIPTION OF THE PREFERRED EMBODIMENTS

The present invention will be described in detail based on the embodiments shown in the figures.

Figure 1B:
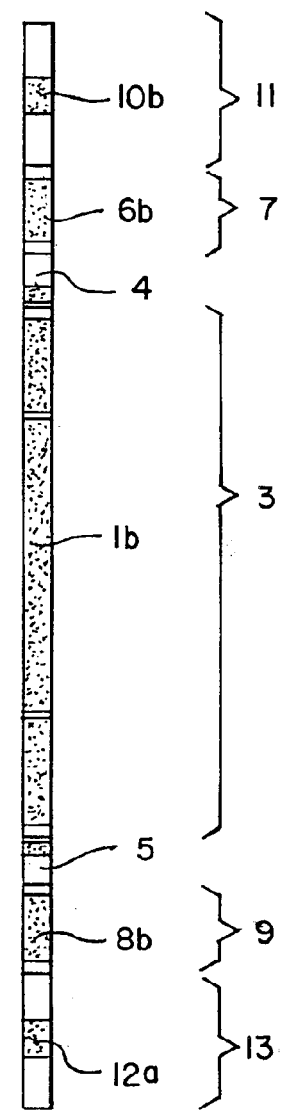
FIG. 1B is a side view of a dual tuning fork vibratory gyro-sensor according to the present invention.
Figure 1B:
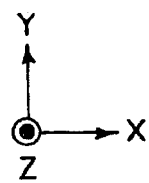
Figure 1B:
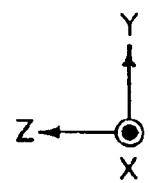

FIGS. 1A and 1B show an external view of a double tuning fork vibratory gyro-sensor according to the present invention. In FIG. 1A, the horizontal plane (attachment plane) is parallel to the plane of the page.

The double tuning fork vibratory gyro-sensor is equipped with: a drive section 3 formed by processing a thin Z-plate crystal section, a section cut so that the normal of the primary substrate plane is oriented along the Z axis of the crystal, in the shape of a double-ended tuning fork, with a predetermined electrode formed on the surface thereof, the drive section 3 including: a pair of prong-shaped arms 1a, 1b and drive electrodes 2a, 2b formed on the surfaces of the arms 1a, 1b; first and second double-ended tuning fork support sections 4, 5 supporting the ends of the drive section 3; a first detection section 7 including first detection electrodes 6a, 6b and detecting vibrations of the arms 1a, 1b by way of the first double tuning fork support section 4; a second detection section 9 including second detection electrodes 8a, 8b and detecting vibrations of the arms 1a, 1b by way of the second double tuning fork support section 5; a first support securing section 11 supporting one end of the first detection section 7 and including lead-out electrodes 10a, 10b connected to the first detection electrodes 6a, 6b; and a second support securing section supporting one end of the second detection section 9 and including lead-out electrodes 12a, 12b connected to the second detection electrodes 8a, 8b. The back side is also formed with the patterns for the drive electrodes and the first and second detection electrodes and the lead-out electrodes are connected by way of patterns on the side surface.

The first and second support securing sections are set up to be secured to an attachment plane (horizontal plane), e.g., the sensor package, using an adhesive agent or the like, but this is not shown in the figures.

The operations performed by the double tuning fork vibratory gyro-sensor shown in FIGS. 1A and 1B will be described.

Figure 2A:
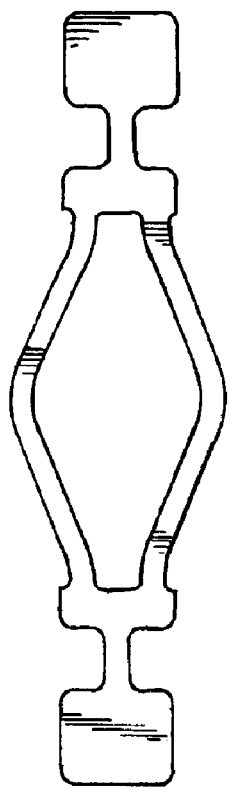
FIGS. 2A and 2B show flexural vibrations of a dual tuning fork vibratory gyro-sensor according to the present invention.
Figure 2A:
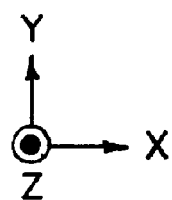

A non-rotating state as illustrated in FIG. 2A is described below. A drive signal is sent to the drive electrodes 2a, 2b, resulting in the arms 1a, 1b experiencing a flexural vibration referred to as an in-plane symmetrical first flexural vibration mode (drive mode). In this case, the arms 1a, 1b vibrate symmetrically on the left and right in the figure.

Figure 2B:
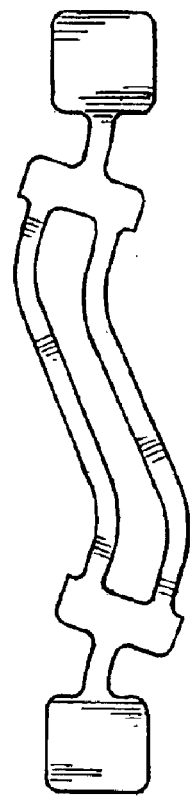
Figure 2B:
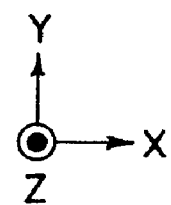

As the double tuning fork vibratory gyro-sensor is vibrating in this drive mode, an angular velocity (rotation) around the crystal Z axis is applied. When this happens, the Coriolis force acts on the arms 1a, 1b, with the force acting on one arm in the Y direction (upward in the figure) and on the other arm in the Y direction (downward in the figure). As a result, the opposite Coriolis forces to the left and right generate a flexural vibration referred to as an in-plane asymmetrical second flexural mode (detection mode) in the arms 1a, 1b, as shown in FIG. 2B.

Moments are then generated at the first and second double tuning fork support sections 4, 5, causing the first and second detection sections 7, 9 to vibrate in the X direction. As a result, two detection voltages corresponding to the vibration and having opposite polarities are generated at the detection electrodes 6a, 6b disposed in the first detection section 7 and the detection electrodes 8a, 8b disposed in the second detection section 9.

Thus, when there is no rotation (drive mode), there is almost no X-axis component vibration at the first and second detection sections 7, 9. Vibrations with an X component occur only when there is rotation (detection mode), so a detection signal with a voltage proportional to the angular velocity of the rotation can be obtained by using the differential component between the two detection voltages output from the first and second detection sections 7, 9. If the direction of rotation is reversed, the polarity of the detection signal is inverted.

Figure 3:
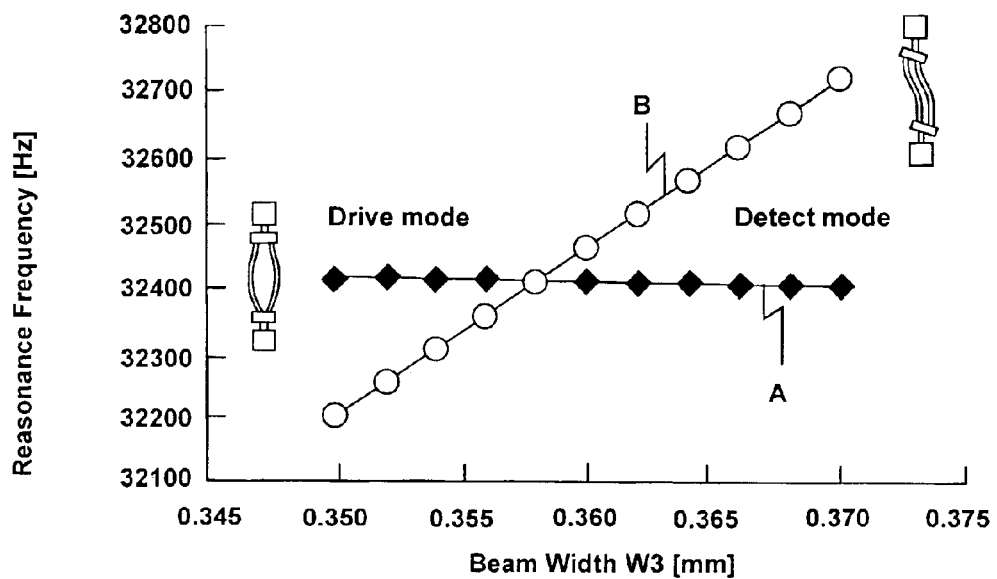
FIG. 3 shows results from a simulation of a dual tuning fork vibratory gyro-sensor according to the present invention.
Figure 4:
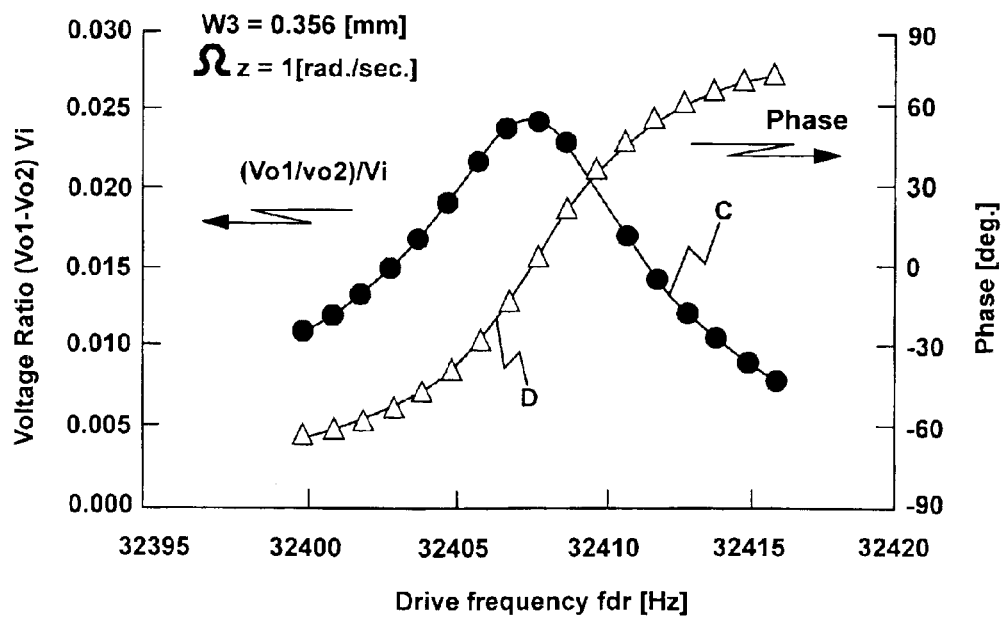
FIG. 4 shows results from a simulation of a dual tuning fork vibratory gyro-sensor according to the present invention.
Figure 5:
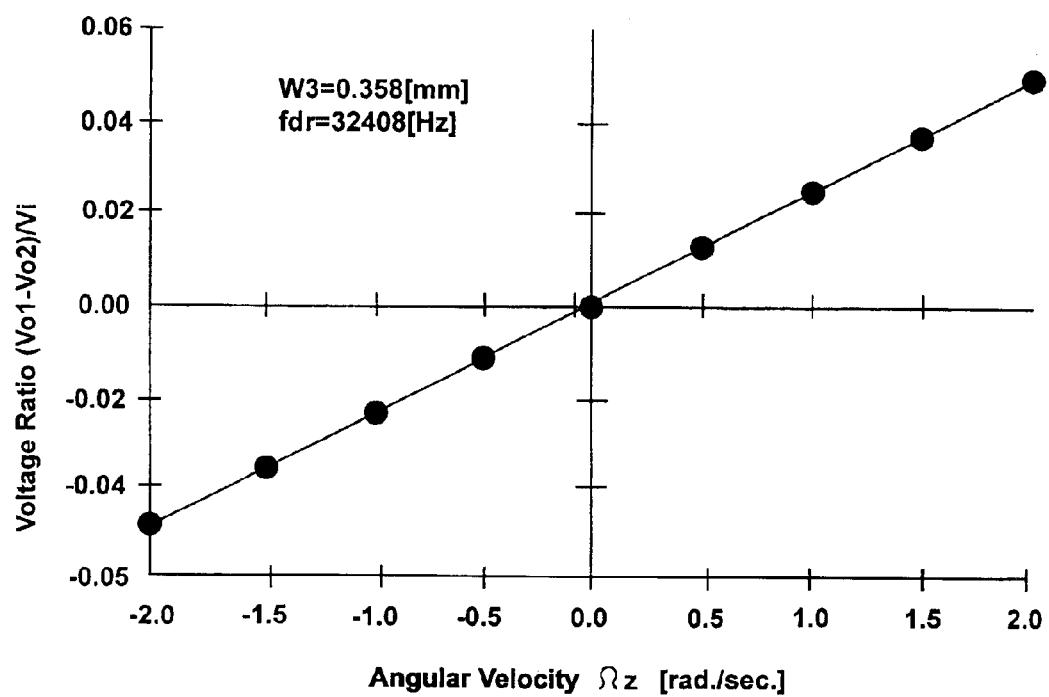
FIG. 5 shows results from a simulation of a dual tuning fork vibratory gyro-sensor according to the present invention.

Next, a simulation of an double tuning fork vibratory gyro-sensor according to the present invention will be described. FIG. 3 through FIG. 5 show results from a simulation of a sensor shaped according to FIG. 1 using ANSYS Rev. 6.0 (ANSYS Inc.), a general-purpose analysis software application.

FIG. 3 shows the change in resonance frequency (vertical axis) relative to the beam width W3 of the detection sections 7, 9 of the double tuning fork vibratory gyro-sensor (horizontal axis). The resonance frequency refers to the frequency at which the arms 1a, 1b will vibrate the most when the frequency of the drive signal applied to the drive electrodes 2a, 2b is changed by a fixed amplitude. This is when the amplitude of the vibration is the greatest.

In FIG. 3, the solid line A indicates the simulation results for the resonance frequency in drive mode (no rotation), and the solid line B indicates the resonance frequency in detection mode (rotation). As FIG. 3 shows, the resonance frequency in detection mode changes in proportion to the width of the detection electrode W3. Also, it was found that the resonance frequencies for the drive mode and the detection mode matched around W3=0.358 mm.

Next, based on the results from the simulation shown in FIG. 3, the detection section width was set to W3=0.356 mm so that the resonance frequencies in the drive mode and the detection mode would differ slightly, and the difference between the resonance frequencies, i.e., the detune frequency, was set to $f\Delta=57.9$ Hz. This prevents mixing of the drive mode and detection mode frequencies.

FIG. 4 shows results from a simulation of amplitude and phase characteristics in which the frequency of the drive signal is varied while there is a fixed rotational angular velocity of $\Omega z=1$ rad/sec. FIG. 4 shows the differential component of the detection voltage (vertical axis) relative to the drive frequency (horizontal axis).

In FIG. 4, the solid line C shows amplitude characteristics from the simulation results and the solid line D shows phase characteristics. The vertical axis values of the amplitude characteristic is the proportion of the differential component (Vo1−Vo2) relative to the drive signal amplitude (Vi), i.e., (Vo1−Vo2)/Vi.

As FIG. 4 shows, the maximum detection signal (differential component) is obtained when the drive frequency fdr=32408 Hz.

As the simulation results from FIG. 5 show, the detection signal is proportional to the rotation angular velocity $\Omega z$, and it can be seen that if the direction of rotation is reversed, the polarity of the detection signal is inverted.

Based on the simulation results in FIG. 3 through FIG. 5, it was found that a dual tuning fork vibratory gyro-sensor can be used as a flatly supported angular velocity sensor. Also, as described above, the double-ended tuning fork gyro-sensor is equipped with two support securing sections, allowing a large support area. This results in a structure in which external vibrations and impacts tend not to be concentrated on a specific position. Thus, greater resistance to vibration and impact can be provided compared to conventional cantilevered and single-point support structures.

As described above, the present invention provides an angular velocity sensor that uses the Coriolis force. The present invention has a flatly supported double-ended tuning fork structure, uses in-plane asymmetrical flexural secondary mode, and allows more support area. This makes it possible to provide a high-precision angular velocity sensor that provides good vibration and impact resistance needed for use in vehicles and the like.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A dual tuning fork vibratory gyro-sensor comprising:

a drive section including two arms, wherein each includes surfaces thereon and ends, and drive electrodes formed on said surfaces of said arms;

a first and a second tuning fork support section supporting said ends of said arms;

a first and a second detection section connected to said first and said second tuning fork support sections respectively and disposed outside said drive section;

a first and a second detection electrode formed on said first and said second detection sections respectively; and a first and a second support securing section supporting an end of said first and second detection sections;

wherein said arms and said drive electrodes and said first and said second tuning fork support sections and said first and said second detection sections and said first and said second detection electrodes and said first and said second support securing sections are formed integrally and detect rotational angular velocity;

when said dual tuning fork gyro-sensor rotates, a Coriolis force acting on said arms causes in-plane asymmetrical flexural secondary mode vibrations to be generated at said arms, said in-plane asymmetrical flexural secondary mode vibrations being transferred to said first and said second detection sections by way of said first and said second dual tuning fork support sections; and a detection signal for a rotational angular velocity is output from said first and second detection electrodes.

2. A dual tuning fork vibratory gyro-sensor as described in claim 1 wherein:

a crystal is used as a base material for said dual tuning fork vibratory gyro-sensor, said crystal being cut so that a normal direction of a main plane is a Z axis of a crystal axis; and said first and second detections sections are formed with a rectangular shape.

3. A dual tuning fork vibratory gyro-sensor as described in claim 1, wherein said first and said second tuning fork support sections each having an inner wall supporting the ends of the arms;

wherein said first and said second tuning fork support sections each having an outer wall connected to one end of said first and said second detection sections; and said detections sections further connected at a second end to the first and second support securing sections.

* * * * *